US008482065B2

(12) United States Patent
Lee

(10) Patent No.: US 8,482,065 B2
(45) Date of Patent: Jul. 9, 2013

(54) MOS TRANSISTOR WITH A REDUCED ON-RESISTANCE AND AREA PRODUCT

(75) Inventor: Zachary K. Lee, Lake Forest, CA (US)

(73) Assignee: Newport Fab, LLC, Newport Beach, CA (US)

(*) Notice: Subject to any disclaimer, the term of this patent is extended or adjusted under 35 U.S.C. 154(b) by 0 days.

(21) Appl. No.: 12/313,924

(22) Filed: Nov. 25, 2008

(65) Prior Publication Data

US 2010/0127326 A1 May 27, 2010

(51) Int. Cl.
*H01L 29/66* (2006.01)
(52) U.S. Cl.
USPC .... 257/336; 257/342; 257/344; 257/E29.279; 257/E29.268; 438/163
(58) Field of Classification Search
USPC .................................. 257/342, 336; 438/163
See application file for complete search history.

(56) References Cited

U.S. PATENT DOCUMENTS

| | | | | |
|---|---|---|---|---|
| 4,053,916 A | * | 10/1977 | Cricchi et al. | 257/353 |
| 5,473,180 A | * | 12/1995 | Ludikhuize | 257/336 |
| 6,133,107 A | * | 10/2000 | Menegoli | 438/306 |
| 6,995,428 B2 | * | 2/2006 | Huang et al. | 257/345 |
| 2004/0217418 A1 | * | 11/2004 | Imam et al. | 257/341 |
| 2004/0251492 A1 | * | 12/2004 | Lin | 257/335 |
| 2005/0179085 A1 | * | 8/2005 | Yamauchi et al. | 257/344 |
| 2005/0205925 A1 | * | 9/2005 | Takizawa | 257/327 |
| 2006/0121666 A1 | * | 6/2006 | Grutzediek et al. | 438/199 |
| 2008/0001198 A1 | * | 1/2008 | Jeon et al. | 257/298 |
| 2009/0008710 A1 | * | 1/2009 | Wei et al. | 257/337 |

* cited by examiner

*Primary Examiner* — Michelle Mandala
*Assistant Examiner* — Shaka White
(74) *Attorney, Agent, or Firm* — Farjami & Farjami LLP

(57) ABSTRACT

According to an exemplary embodiment, a MOS transistor, such as an LDMOS transistor, includes a gate having a first side situated immediately adjacent to at least one source region and at least one body tie region. The MOS transistor further includes a drain region spaced apart from a second side of the gate. The MOS transistor further includes a body region in contact with the at least one body tie region, where the at least one body tie region is electrically connected to the at least one source region. The MOS transistor further includes a lightly doped region separating the drain region from the second side of the gate. The lightly doped region can isolate the body region from an underlying substrate.

20 Claims, 4 Drawing Sheets

MOS TRANSISTOR WITH A REDUCED ON-RESISTANCE AND AREA PRODUCT

BACKGROUND OF THE INVENTION

1. Field of the Invention

The present invention generally relates to the field of semiconductors. More particularly, the invention relates to transistor semiconductors structures.

2. Background Art

Various types of MOS (Metal Oxide Semiconductor) transistors, such as Lateral Diffusion Metal Oxide Semiconductor (LDMOS) transistors, can be utilized as power transistors in high voltage switches and power amplifiers in cell phones and other wireless communication devices, as well as other types of applications that require a high power transistor. In a MOS transistor, such as an LDMOS power transistor, the source region and the body region of the transistor are typically tied together to prevent a parasitic bipolar transistor from turning on and possibly destroying the power transistor, where the base, emitter, and collector of parasitic bipolar transistors are formed by the body region, source region, and drain region of MOS transistors, respectively. To effectively couple the source region to the body region of the transistor, a body tie region is typically situated close to the source region to reduce resistance. However, the body tie region can undesirably increase the area or footprint of the MOS transistor in a semiconductor die.

In a conventional LDMOS transistor, for example, a source region can be situated between a body tie region and a first side of a gate and a drain region can be spaced apart from a second side of the gate by a lightly doped region. In the conventional LDMOS transistor, the body tie region and the source region can be situated in a body region. A body tie contact on the body tie region and a source contact on the source region can be electrically connected so as to cause a potential of the source region to be substantially equal to a potential of the body region, thereby preventing the aforementioned parasitic bipolar transistor from turning on and possibly destroying the conventional LDMOS transistor. However, the body tie region can undesirably increase the area (i.e. the footprint) of the conventional LDMOS transistor on the semiconductor die.

SUMMARY OF THE INVENTION

A MOS transistor with a reduced on-resistance and area product, substantially as shown in and/or described in connection with at least one of the figures, as set forth more completely in the claims.

DETAILED DESCRIPTION OF THE INVENTION

The present invention is directed to a MOS transistor with a reduced on-resistance and area product. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

The present invention achieves an innovative MOS transistor, such as an LDMOS power transistor. As will be discussed in detail below, the present invention advantageously achieves a MOS transistor, such as an LDMOS transistor, having a reduced product of on-resistance and area (i.e. footprint) on a semiconductor die. In the present application, an N-channel MOS (NMOS) transistor, such as an N-channel LDMOS transistor, is utilized to illustrate an embodiment of the invention. However, as is manifest to one of ordinary skill in the art, other embodiments of the invention can be applied to a P-channel MOS (PMOS) transistor, such as a P-channel LDMOS transistor by, among other things, appropriately reversing the conductivity type of N type and P type regions in the N-channel LDMOS transistor.

Figure 1:
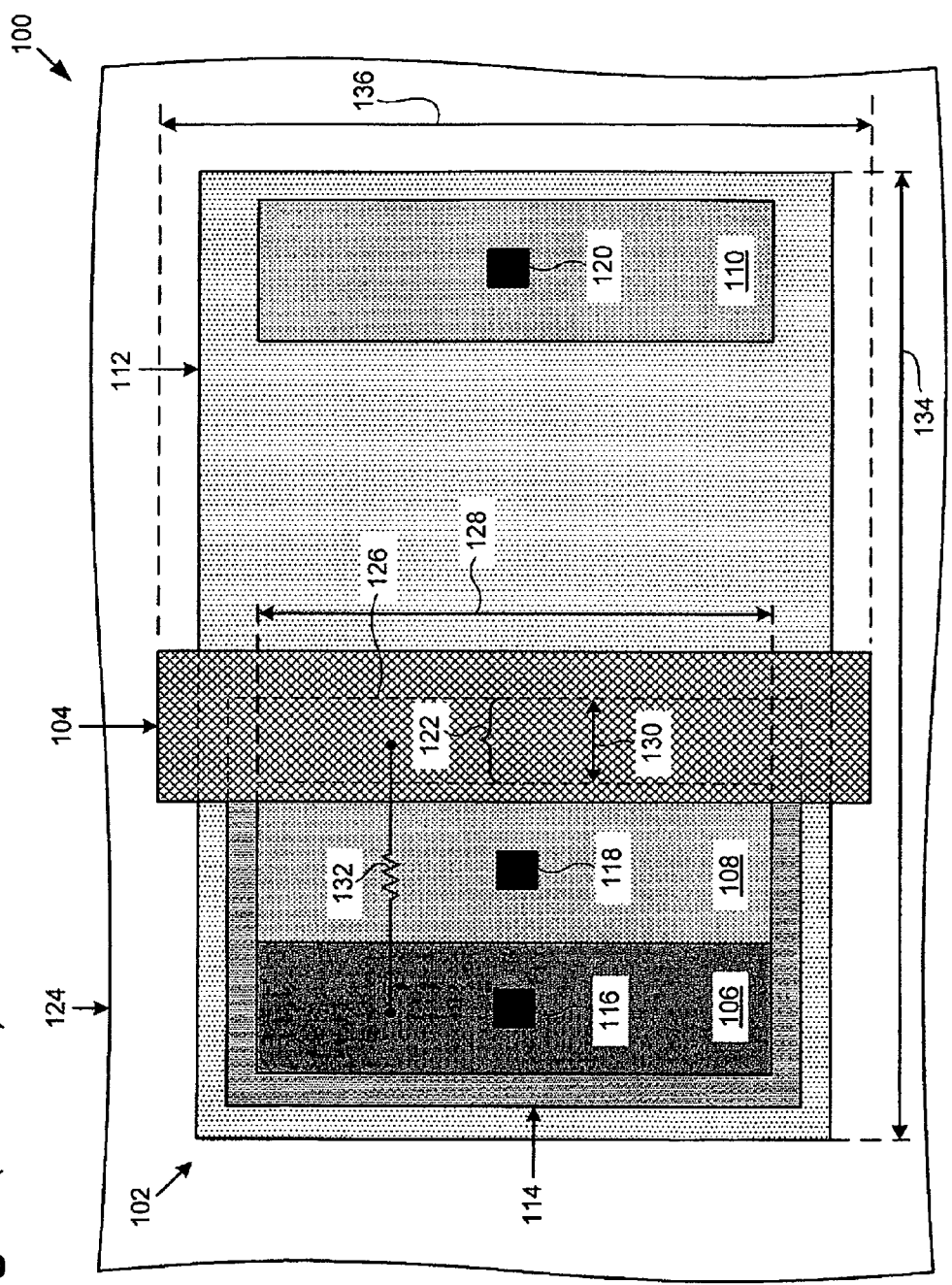
FIG. 1 illustrates a top view of an exemplary structure including a conventional exemplary LDMOS transistor.

FIG. 1 shows a top view of a portion of a semiconductor die including a conventional exemplary transistor, such as an LDMOS power transistor. Certain details and features have been left out of FIG. 1, which are apparent to a person of ordinary skill in the art. Structure 100 includes conventional transistor 102, which includes gate 104, body tie region 106, source region 108, drain region 110, lightly doped region 112, body region 114, body tie contact 116, source contact 118, drain contact 120, and channel region 122. Structure 100 also includes substrate 124, which can be, for example, a P type silicon substrate. Conventional transistor 102 can be a MOS power transistor, such as an N-channel LD (lateral diffusion) MOS power transistor, and can be utilized in a high voltage switch or a power amplifier in cell phones or other wireless communication devices, as well as other types of applications that require a high voltage transistor.

As shown in FIG. 1, lightly doped region 112 is situated in substrate 124 and drain region 110 is situated in lightly doped region 112. Lightly doped region 112 can be a well, such as an N well, and which can be lightly doped with an N type dopant, for example. Drain region 110 can comprise, for example, a heavily doped N type region. Also shown in FIG. 1, body region 114 is situated in lightly doped region 112 and body tie region 106 and source region 108 are situated in body region 114. Body region 114 extends below body tie region 106 and source region 108 and is isolated from substrate 124 by light doped region 112, which is situated between body region 114 and substrate 124. Body region 114 can comprise a P type region, body tie region 106 can comprise a heavily doped P type region, and source region 108 can comprise a heavily doped N type region, for example.

Further shown in FIG. 1, channel region 122 is situated between source region 108 and interface 126, which is formed at a boundary between lightly doped region 112 and body region 114, and gate 104 is situated over channel region 122, a portion of source region 118, and a portion of lightly doped region 112. As shown, channel region 122 has width 128 and length 130. Gate 104 can comprise polycrystalline silicon (polysilicon or poly), which can be heavily doped with, for example, a suitable N type dopant. A gate dielectric (not shown in FIG. 1) can be situated between gate 104 and channel region 122 and can comprise silicon oxide or other type of dielectric material.

Also shown in FIG. 1, body tie contact 116, source contact 118, and drain contact 120 are situated on body tie region 106, source region 108, and drain region 110, respectively. Body tie contact 116, source contact 118, and drain contact 120 can each comprise a metal, metal stack, or metal alloy as known in the art. Body tie contact 116 can be connected to source contact 118 by a metal segment (not shown in FIG. 1) in a overlying metal layer in, for example, a first (i.e. M1) metal layer in a semiconductor die. By connecting body tie contact 116 to source contact 118, source region 108 can be tied to body region 114, thereby causing the potential of source region 108 to be substantially equal to the potential of body region 114. The aforementioned configuration can prevent the potential of body region 114 from exceeding the potential of source region 108 and, thereby, turning on a parasitic bipolar transistor having a base formed by body region 114, an emitter formed by source region 108, and a collector formed by drain region 110. If the parasitic bipolar transistor turns on, for example, it can cause a sufficiently large current to flow from drain region 110 to source region 108 so as to destroy conventional transistor 102.

For example, if the potential of body region 114 sufficiently exceeds the potential of source region 108, the PN junction formed by body region 114 and source region 118 can become forward biased and, thereby, turn on the parasitic bipolar transistor by causing current to flow from body region 114 to source region 118. When the parasitic bipolar transistor turns on, it can cause a large current that is not under the control of gate 104 to flow from drain region 110 (i.e. the collector of the parasitic bipolar transistor) to source region 108 (i.e. the emitter of the parasitic bipolar transistor). However, if this uncontrolled current is sufficiently large, it can destroy conventional transistor 102.

To prevent a voltage drop from occurring between body tie contact 116 and source contact 118, which can cause the potential of body region 114 to deviate from the potential of source region 108, the resistance between body tie contact 116 and source contact 118 can be reduced by placing body tie region 106 close to source region 108. Also, to control the parasitic bipolar transistor in a MOS power transistor, such as conventional transistor 102, it is desirable to reduce parasitic resistance 132 between body tie region 108 and body region 114 in channel region 122 by placing body tie region 108 close to gate 104.

In conventional transistor 102, body tie region 106 increases dimension 134, which represents the length of conventional transistor 102 in an x-direction. However, the area of conventional transistor 102 (i.e. the footprint of the transistor) on the semiconductor die is equal to the product of dimension 134 and dimension 136 (i.e. the length of conventional transistor 102 in the y-direction). Thus, by increasing dimension 134, the area (i.e. the footprint) of conventional transistor 102 is also increased. However, in an LDMOS transistor, such as conventional transistor 102, it is desirable to reduce the product of on-resistance and area of the transistor, which defines a figure of merit of an LDMOS transistor. The on-resistance (Rdson) of conventional transistor 102 can be defined as the drain-to-source resistance (i.e. the resistance from drain region 110 to source region 108) when the transistor is in an on-state (i.e. turned on). Thus, since body tie region 108 causes dimension 134 to increase, it (i.e. body tie region 108) causes an undesirable increase in the product of on-resistance and transistor area.

Figure 2:
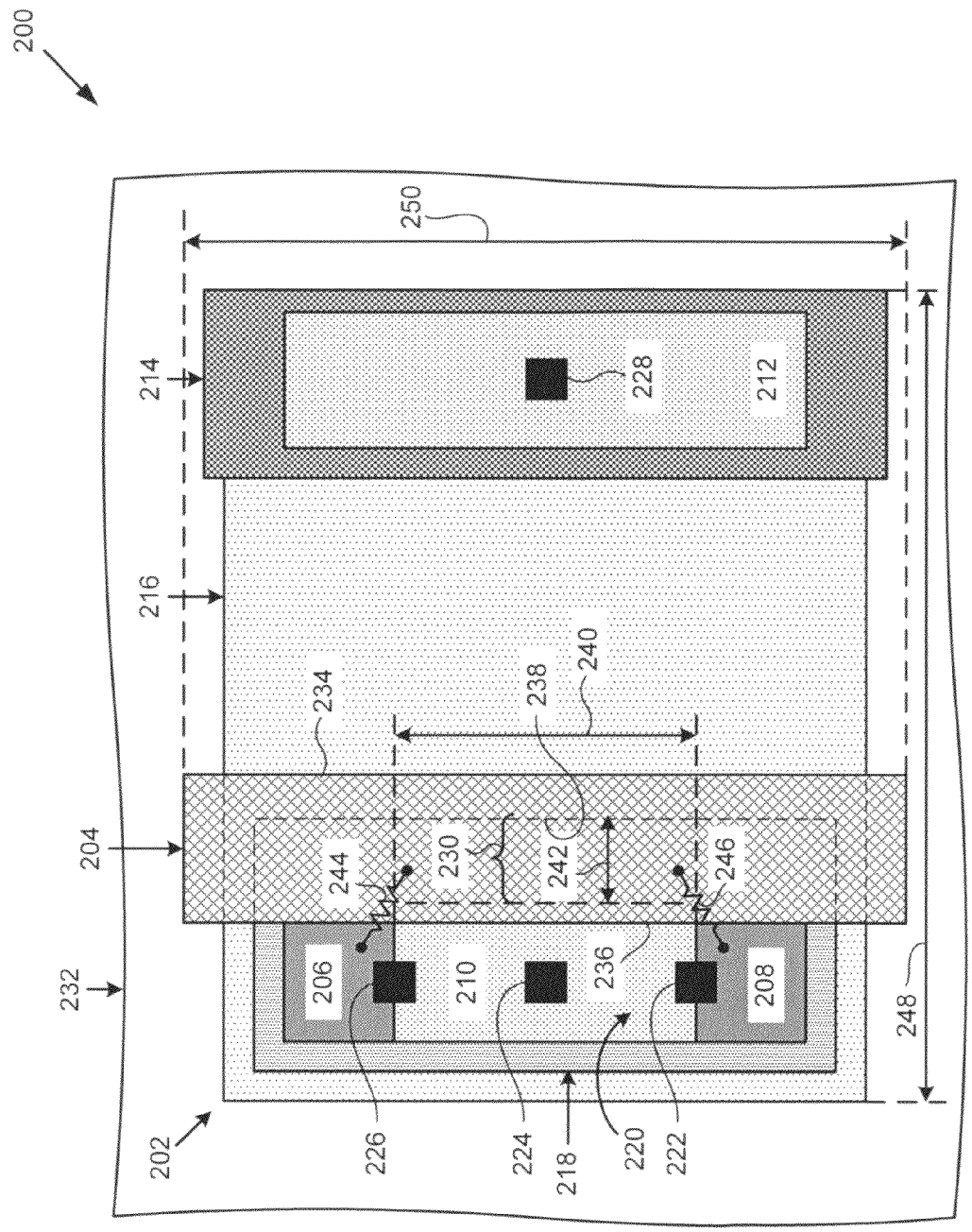
FIG. 2 illustrates a top view of an exemplary structure including an exemplary MOS transistor, such as an LDMOS transistor, in accordance with one embodiment of the present invention.

FIG. 2 shows a top view of a portion of a semiconductor die including an exemplary transistor in accordance with one embodiment of the present invention. Certain details and features have been left out of FIG. 2, which are apparent to a person of ordinary skill in the art. Structure 200 includes transistor 202, which includes gate 204, body tie regions 206 and 208, source region 210, drain region 212, LDD (lightly doped drain) region 214, lightly doped region 216, body region 218, silicide layer 220, body tie/source contacts 222, 224, and 226, drain contact 228, and channel region 230. Structure 200 also includes substrate 232, which can be a lightly doped P type silicon substrate in one embodiment.

Transistor 202 can be, for example, an N-channel MOS power transistor, such as an N-channel LDMOS power transistor in one embodiment. In another embodiment, transistor 202 can be a P-channel MOS transistor, such as a P-channel LDMOS power transistor. In one embodiment, transistor 202 can be a power LDMOS transistor in which the voltage between drain region 212 and source region 210 can be, for example, approximately equal to 16.0 volts. In other embodiments, transistor 202 can be a low power N-channel or P-channel MOS or LDMOS transistor. In one embodiment, transistor 202 can be utilized in, for example, high voltage switches or power amplifiers in cell phones or other wireless communication devices. However, transistor 202 can also be utilized in other types of applications that require a high voltage transistor.

As shown in FIG. 2, lightly doped region 216 is situated in substrate 232 and LDD region 214 is situated adjacent to lightly doped region 216 and also situated in substrate 232. Lightly doped region 216 extends under gate 204 and also extends under and surrounds body region 218, thereby isolating body region 218 from substrate 232. In one embodiment, lightly doped region 216 can comprise a lightly doped drift region, which extends under only a portion of gate 204. In such embodiment, the body of transistor 202 is formed by substrate 232 and/or body region 218.

Lightly doped region 216 can be formed, for example, by implanting an N type dopant in substrate 232 to form an N well prior to the formation of LDD region 214. LDD region 214 can comprise, for example, a light doped N type region and can be formed in a CMOS process flow in one embodiment. Lightly doped region 216 and LDD region 214 can reduce hot-carrier degradation while improving a "safe-operating area" and on-resistance of transistor 202. A "safe-operating area" specifies a range of voltage/current values within which an LDMOS transistor, such as transistor 202, can be operated without damaging or destroying the transistor.

Further shown in FIG. 2, drain region 212 is situated in LDD region 214 and body region 218 is situated in lightly doped region 216 and extends under gate 204. Drain region 212 is also spaced apart from side 234 of gate 204 by lightly doped region 216. In other words, lightly doped region 216 is situated between drain region 212 and side 234 of gate 204. Drain region 212 can comprise, for example, a heavily doped N type region in one embodiment. Body region 218, which is isolated from substrate 232 by lightly doped region 216 (e.g. an N well), can comprise, for example, a P type region. In other embodiments, body region 218 is not utilized or body region 218 is not isolated from substrate 232.

Also shown in FIG. 2, body tie regions 206 and 208 and source region 210 are situated in lightly doped region 216 and situated adjacent to and aligned along side 236 of gate 204. Also, body tie regions 206 and 208 are each situated adjacent to source region 220. Body tie regions 206 and 208 can each comprise, for example, a heavily doped P type region in one embodiment. Source region 210 can comprise, for example, a heavily doped N type region in one embodiment. In one embodiment, a plurality of body tie regions, such as body tie regions 206 and 208, and a plurality of source regions, such as source region 210, can be situated adjacent to side 236 of gate 204, wherein each body tie region is situated adjacent to at least one source region.

Further shown in FIG. 2, silicide layer 220 is situated in source region 210 and body tie regions 206 and 208 and electrically connects source region 210 to body tie regions 206 and 208. Silicide layer 220 can comprise a suitable metal silicide as is known in the art. By providing silicide layer 220 to electrically connect body tie regions 206 and 208 to source region 210, source region 210 is tied to body region 218, thereby causing the potential of source region 210 to be substantially equal to the potential of body region 218. As a result, the potential of body region 218 can be prevented from exceeding the potential of source region 210 so as to prevent the turning on of a parasitic bipolar transistor having a base formed by body region 218, an emitter formed by source region 210, and a collector formed by drain region 212. If the aforementioned parasitic bipolar transistor turns on, it can cause large current flows, and possibly a "snapback" condition, in substrate 232 which can cause permanent damage to the transistors, such as transistor 202.

Also shown in FIG. 2, channel region 230 is situated under gate 204 and situated between source region 210 and interface 238, which is formed at the boundary between lightly doped region 216 and body region 218. As shown, channel region 230 has length 242 and width 240, which represents the channel region width at source region 210. Since no significant amount of current flows between body tie regions 206 and 208 and drain 212, body tie regions 206 and 208 reduce the channel region width. It is noted that the "effective width" of the channel region is reduced somewhat, but not entirely by the width of the body tie regions since the current can spread (or fringe) into the regions occupied by the body ties. As shown, gate 204 is situated over channel region 230, a portion of source region 210, a portion of body region 218, and lightly doped region 216. Gate 204 can comprise polysilicon, which can be heavily doped with, for example, an N type dopant. A gate dielectric (not shown in FIG. 2) can be situated between gate 204 and channel region 230 and can comprise silicon oxide or other type of dielectric material. In one embodiment, a pocket implant region can be formed under side 236 of gate 204. The pocket implant region can comprise, for example, a heavily doped P type region in one embodiment. In another embodiment, a source-side LDD region (different or similar to LDD region 214) may also exist under side 236 of gate 204.

Further shown in FIG. 2, body tie/source contacts 222, 224, and 226 are situated on silicide layer 220 and drain contact 228 is situated on drain region 212. Body tie/source contacts 222, 224, and 226 and drain contact 228 can each comprise a suitable metal, metal stack, or metal alloy as is known in the art. Body tie/source contacts 222, 224, and 226 can be connected to a metal segment (not shown in FIG. 2) in an overlying metal layer, such as a first (i.e. M1) metal layer in the semiconductor die. The metal segment (not shown in FIG. 2) can be connected to a desired source voltage, which can be, for example, between Vdd and ground. Thus, since silicide layer 220 electrically connects body tie regions 222, 224, and 226 to source region 210, body region 218 and source region 210 can be connected to the same source voltage.

Thus, in an embodiment of the invention's transistor 202, body tie regions 206 and 208 are situated adjacent to side 236 of gate 204. In contrast, in conventional transistor 102 in FIG. 1, source region 108 is situated between body tie region 106 and gate 104. Thus, the distance between body tie regions 206 and 208 and channel region 230 is significantly less than the distance between body tie region 106 and channel region 122 in conventional transistor 102. As a result, parasitic resistances 244 and 246, which are formed between respective body tie regions 206 and 208 and channel region 230, are significantly less than parasitic resistance 132, which is formed between body tie region 106 and channel region 122. Also, lower parasitic body tie region-to-channel region resistance provides increased control over the parasitic bipolar transistor. Thus, by reducing the distance between body tie regions 206 and 208, an embodiment of the invention's transistor 202 achieves greater control over the parasitic bipolar transistor compared to conventional transistor 102.

Also, as shown in FIG. 2, area of transistor 202 (i.e. the footprint of transistor 202) on the semiconductor die is substantially equal to the product of dimension 248, which represents the approximate length of transistor 202 in x-direction, and dimension 250, which represents the approximate length of transistor 202 in the y-direction. By situating body tie regions 206 and 208 immediately adjacent to gate 204, dimension 248 of transistor 202 can be significantly reduced compared to dimension 134 of conventional transistor 102. However, dimension 250 (i.e. the length of transistor 202 in the y-direction) is approximately equal to dimension 136 (i.e. the length of conventional transistor 102 in the y-direction). Thus, by significantly reducing dimension 248 by forming body tie regions 206 and 208 immediately adjacent to gate 204, an embodiment of the invention achieves a transistor, such as an LDMOS transistor, having a significantly reduced area (i.e. footprint) compared to a conventional LDMOS transistor.

As discussed above, a figure of merit for an LDMOS transistor, such as transistor 202, is represented by the product of on-resistance (i.e. the drain-to-source resistance when the transistor is turned on) and area of the LDMOS transistor. In conventional transistor 102, channel width 128 is greater than channel width 240 of transistor 202. Since on-resistance is inversely proportional to channel width, the on-resistance of conventional transistor 102 is less than the on-resistance of transistor 202. However, the area (i.e. the footprint) of an embodiment of the invention's transistor 202 is significantly less than the area of conventional transistor 102. As a result, an embodiment of the invention achieves an LDMOS transistor, such as transistor 202, having a reduced product of on-resistance and transistor area compared to a conventional LDMOS transistor, such as conventional transistor 102 in FIG. 1.

Also, by providing silicide layer 220 to electrically connect body tie regions 206 and 208 to source region 210, an embodiment of the invention achieves a transistor, such as an LDMOS transistor, having reduced resistance between source region and body region compared to a conventional LDMOS transistor. Additionally, silicide layer 220 allows body tie/source contacts to be advantageously placed at any desired location over any one or any combination of body tie regions 206 and 208 and source region 210.

Figure 3:
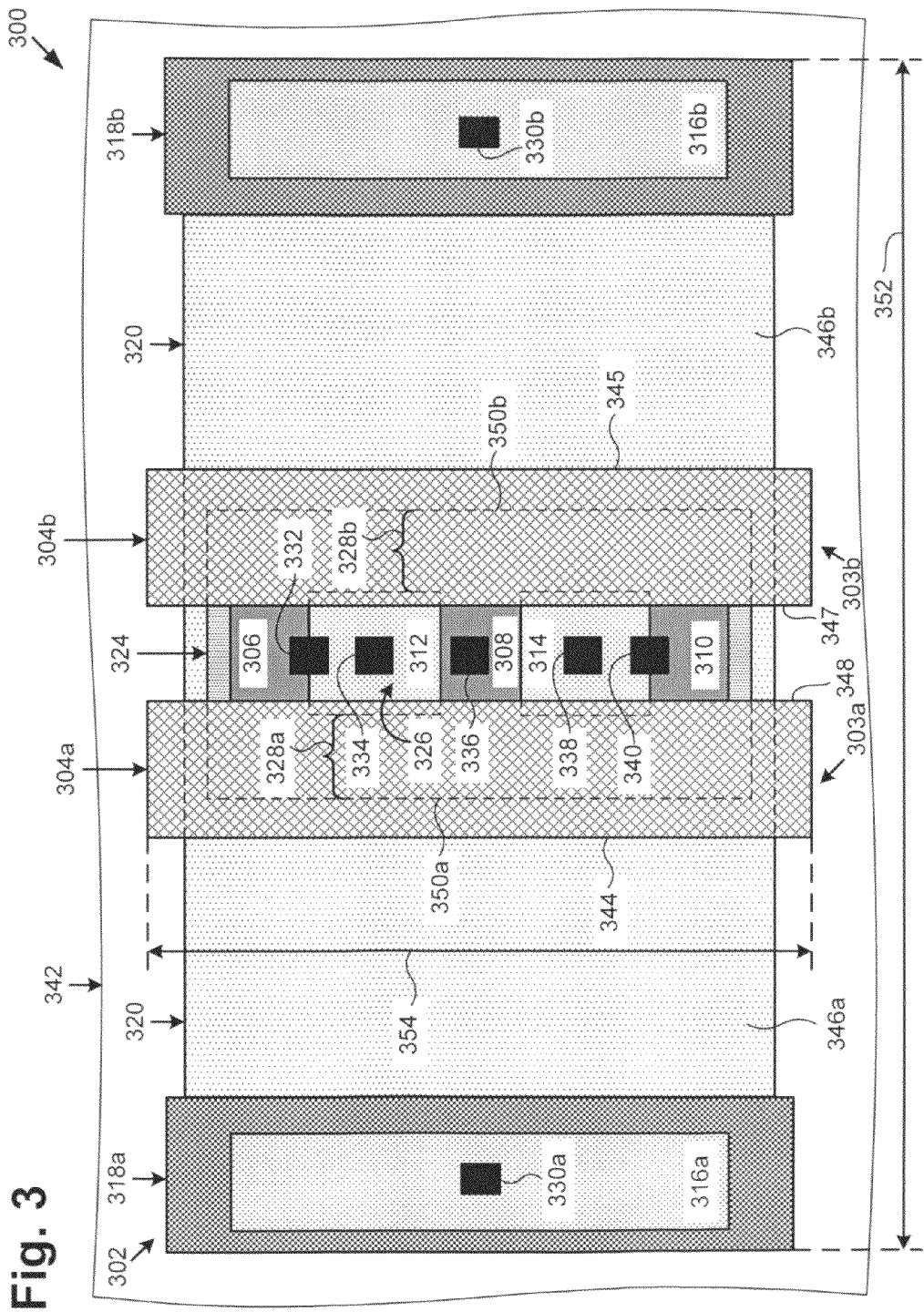
FIG. 3 illustrates a top view of an exemplary structure including an exemplary MOS transistor, such as an LDMOS transistor, having multiple gate fingers in accordance with one embodiment of the present invention.

FIG. 3 shows a top view of a portion of a semiconductor die including an exemplary transistor in accordance with one embodiment of the present invention. Certain details and features have been left out of FIG. 3, which are apparent to a person of ordinary skill in the art. Structure 300 includes transistor 302, which includes gate fingers 304a and 304b, body tie regions 306, 308, and 310, source regions 312 and 314, drain regions 316a and 316b, LDD (lightly doped drain) regions 318a and 318b, lightly doped region 320, body region 324, silicide layer 326, channel regions 328a and 328b, drain contacts 330a and 330b, and body tie/source contacts 332, 334, 336, 338, and 340 (hereinafter "body tie/source contacts 332 through 340").

Structure 300 also includes substrate 342, which can be a lightly doped P type silicon substrate in one embodiment. Transistor 302 includes sub-transistor 303a, which includes gate finger 304a, drain region 316a, channel region 328a, and sub-transistor 303b, which includes gate finger 304b, drain region 316b, channel region 328b. Sub-transistors 303a and 303b each include respective portions of lightly doped region 320 and body region 324 and share body-tie regions 306, 308, and 310, and source regions 312 and 314. It is noted that although transistor 302 includes only two gate fingers to illustrate an embodiment of the present invention, the invention can also be applied to a transistor, such as an LDMOS transistor, having more than two gate fingers.

Transistor 302 can be, for example, an N-channel MOS power transistor, such as an N-channel LDMOS power transistor in one embodiment. In one embodiment, transistor 302 can be a P-channel MOS transistor, such as a P-channel LDMOS transistor. In one embodiment, transistor 302 can be a power LDMOS transistor wherein the voltage between each of drain regions 316a and 316b and source regions 312 and 314 can be, for example, approximately equal to 16.0 volts. In other embodiments, transistor 302 can be a low power N-channel or P-channel MOS or LDMOS transistor. Transistor 302 can be utilized in similar applications as discussed above with respect to transistor 202 in FIG. 2.

As shown in FIG. 3, lightly doped region 320 is situated in substrate 342 and LDD regions 318a and 318b are situated adjacent to lightly doped region 320 and also situated in substrate 342. Lightly doped region 320 extends under gate fingers 304a and 304b and extends under and surrounds body region 324, thereby isolating body region 324 from substrate 342. In one embodiment, lightly doped region 320 can comprise two lightly doped drift regions, where one lightly doped drift region extends from LDD region 318a to gate finger 304a and the other lightly doped drift region extends from LDD region 318b to gate finger 304b. In such embodiment, the body of transistor 302 is formed by substrate 342 and body region 324 is not utilized. In another embodiment, a body region can still be utilized but not isolated from the substrate (i.e. a lightly doped region does not go underneath the source region).

Lightly doped region 320 can be formed, for example, by implanting an N type dopant in substrate 342 to form an N well prior to formation of LDD regions 318a and 318b. LDD regions 318a and 318b can each comprise, for example, a light doped N type region and can be formed in a CMOS process flow. Lightly doped region 320 and LDD regions 318a and 318b can reduce hot-carrier degradation while improving the safe-operating area and the on-resistance of transistor 302.

Further shown in FIG. 3, drain region 316a is situated in LDD region 318a, drain region 316b is situated in LDD region 318b, and body region 324 is situated in lightly doped region 320 and extends under gate fingers 304a and 304b.

Also, drain region 316a is spaced apart from side 344 of gate finger 304a by portion 346a of lightly doped region 320 and drain region 316b is spaced apart from side 345 of gate finger 304b by portion 346b of lightly doped region 320. Drain regions 316a and 316b can each comprise, for example, a heavily doped N type region in one embodiment. Body region 324, which is isolated from substrate 342 by lightly doped region 320 (e.g. an N well), can comprise, for example, a P type region.

Also shown in FIG. 3, body tie regions 306, 308, and 310 and source regions 312 and 314 are situated in body region 324 and are also situated between side 348 of gate finger 304a and side 347 of gate finger 304b. Also, body tie region 306 is situated adjacent to source region 312, source region 312 is situated adjacent to body tie region 308, body tie region 308 is situated adjacent to source region 314, and source region 314 is situated adjacent to body tie region 310. Body tie regions 306, 308 and 310 can each comprise, for example, a heavily doped P type region in one embodiment. Source regions 312 and 314 can each comprise, for example, a heavily doped N type region in one embodiment.

Further shown in FIG. 3, silicide layer 326 is situated in source regions 312 and 314 and body tie regions 306, 308, and 310, thereby electrically connecting source regions 312 and 314 to body tie regions 306, 308, and 310. Silicide layer 326 can comprise a suitable metal silicide as is known in the art. By providing silicide layer 326 to electrically connect body tie regions 306, 308, and 310 to source regions 312 and 314, source regions 312 and 314 are tied to body region 324, which causes the potential of each of source regions 312 and 314 to be substantially equal to the potential of body region 324. As a result, the potential of body region 324 can be prevented from exceeding the potential of source regions 312 and 314 and, thereby, turning on a parasitic bipolar transistor, which has a base formed by body region 324, an emitter formed by source regions 312 and 314, and a collector formed by drain region 316a or a like parasitic bipolar transistor, which has a base formed by body region 324, an emitter formed by source regions 312 and 314, and a collector formed by drain region 316b. If the parasitic bipolar transistors turn on, they can cause large current flows and possible damage, for example, by creating a snapback condition as stated above. If either sub-transistor 303a or sub-transistor 303b is destroyed, transistor 302 is also destroyed.

Also shown in FIG. 3, channel region 328a is situated between source regions 312 and 314 and interface 350a, which is formed at the boundary between portion 346a of lightly doped region 320 and body region 324, and gate finger 304a is situated over channel region 328a, portions of source regions 312 and 314, and lightly doped region 320. Further shown in FIG. 3, channel region 328b is situated between source regions 312 and 314 and interface 350b, which is formed at the boundary between portion 346b of lightly doped region 320 and body region 324, and gate finger 304b is situated over channel region 328b, portions of source regions 312 and 314, and lightly doped region 320. Gate fingers 304a and 304b can each comprise polysilicon, which can be heavily doped with, for example, an N type dopant in one embodiment. Respective gate dielectrics (not shown in FIG. 3) can be situated between gate fingers 304a and 304b and channel regions 328a and 328b and can each comprise silicon oxide or other type of dielectric material.

Further shown in FIG. 3, body tie/source contacts 332 through 340 are situated on silicide layer 326 and drain contacts 330a and 330b are situated on respective drain regions 316a and 316b. Body tie/source contacts 332 through 340 and drain contact 330a and 330b can each comprise a suitable metal, metal stack, or metal alloy as is known in the art. Body tie/source contacts 332 through 340 can be connected to a metal segment (not shown in FIG. 3) in an overlying metal layer, such as a first (i.e. M1) metal layer in the semiconductor die. The metal segment (not shown in FIG. 3) can be connected to a desired source potential, which can be, for example, between Vdd and ground. Thus, since silicide layer 326 electrically connects body tie regions 306, 308, and 310 to source regions 312 and 314, body region 324 and source regions 312 and 314 can be connected to the same voltage.

In an embodiment of the invention's transistor 302, body tie regions 306, 308, and 310 are situated adjacent to side 348 of gate finger 304a and adjacent side 347 of gate finger 304b. By situating body tie regions 306, 308, and 310 immediately adjacent to respective sides 348 and 347 of gate fingers 304a and 304b, the distance between body tie regions 306, 308, and 310 and each of channel regions 328a and 328b is reduced compared to a conventional LDMOS transistor having two gate fingers that are separated by a body tie region situated between two source regions. As a result, an embodiment of the invention's transistor 302, such as an LDMOS transistor having two gate fingers, achieves a significantly lower parasitic body tie region-to-channel region resistance compared to the parasitic body tie region-to-channel region resistance of a conventional LDMOS dual gate finger transistor. Also, as discussed above, a lower parasitic body-tie region-to-channel region resistance results in increased parasitic bipolar transistor control. Thus, by reducing the distance between body tie regions 306, 308, and 310 and channel regions 328a and 328b, an embodiment of the invention's transistor 302 achieves increased parasitic bipolar transistor control compared to a conventional LDMOS dual gate finger transistor.

Also, as shown in FIG. 3, the area of transistor 302 (i.e. the footprint of transistor 302) on the semiconductor die is substantially equal to the product of dimension 352, which represents the approximate length of transistor 302 in x-direction, and dimension 354, which represents the approximate length of transistor 302 in the y-direction. By situating body tie regions 306, 308, and 310 immediately adjacent to gate fingers 304a and 304b, dimension 352 of transistor 302 is significantly reduced compared to an x-direction length of a conventional LDMOS dual gate finger transistor. However, dimension 354 (i.e. the length of transistor 302 in the y-direction) can be approximately equal to a y-direction length of the conventional LDMOS dual gate finger transistor. Thus, by significantly reducing dimension 352 by forming body tie regions 306, 308, and 310 immediately adjacent to gate fingers 304a and 304b, an embodiment of the invention achieves a transistor, such as an LDMOS dual gate finger transistor, having a significantly reduced area (i.e. footprint) compared to conventional LDMOS dual gate finger transistor.

As discussed above, a figure of merit for an LDMOS transistor, such as transistor 302, is represented by the product of on-resistance and area of the LDMOS transistor. In transistor 302, the active channel width under each of gate fingers 304a and 304b is effectively reduced by body tie regions 306, 308, and 310, since no significant amount of current flows between body tie regions 306, 308, and 310 and drain regions 316a and 316b. As a result, body tie regions 306, 308, and 310 increase the on-resistance (i.e. the drain-to-source resistance when the transistor is turned on) of sub-transistors 303a and 303b, thereby increasing the on-resistance of transistor 302. However, the reduction in the area (i.e. the footprint) of transistor 302 caused by body tie regions 306, 308, and 310 is significantly greater than the increase in on-resistance caused by body tie regions 306, 308, and 310. Consequently, an embodiment of the invention achieves an LDMOS dual gate finger transistor, such as transistor 302, having a reduced product of on-resistance and transistor area compared to a conventional LDMOS dual gate finger transistor.

Also, by providing silicide layer 326 to electrically connect body tie regions 306, 308, and 310 to source regions 312 and 314, an embodiment of the invention in FIG. 3 provides a transistor, such as an LDMOS dual gate finger transistor, having reduced resistance between source regions and body region. Additionally, silicide layer 326 allows body tie/source contacts to be placed at any desired location over any one or over any combination of body tie region 306, 308, and 310, and source regions 312 and 314.

Figure 4:
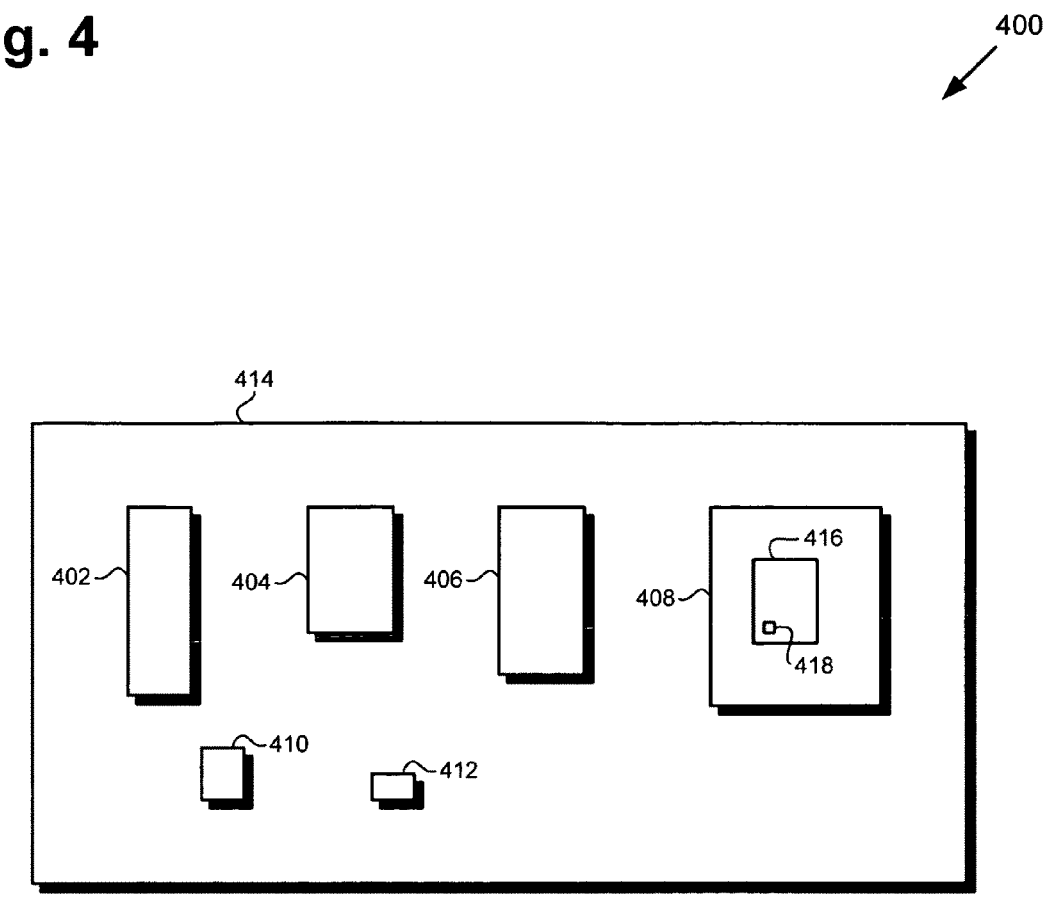
FIG. 4 illustrates a diagram of an exemplary electronic system including an exemplary chip or die utilizing one or more MOS transistors, such as LDMOS transistors, in accordance with one embodiment of the present invention.

FIG. 4 illustrates a diagram of an exemplary electronic system including an exemplary chip or die utilizing one or more LDMOS transistors in accordance with one embodiment of the present invention. Electronic system 400 includes exemplary modules 402, 404, and 406, IC chip or semiconductor die 408, discrete components 410 and 412, residing in and interconnected through circuit board 414. In one embodiment, electronic system 400 may include more than one circuit board. IC chip 408 includes circuit 416, which utilizes one or more of the invention's transistors, such as LDMOS transistors, designated by numeral 418.

As shown in FIG. 4, modules 402, 404, and 406 are mounted on circuit board 414 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electromechanical motor control module, or a field programmable gate array (FPGA), or any other kind of module utilized in modern electronic circuit boards. Circuit board 414 can include a number of interconnect traces (not shown in FIG. 4) for interconnecting modules 402, 404, and 406, discrete components 410 and 412, and IC chip 408.

Also shown in FIG. 4, IC chip 408 is mounted on circuit board 414 and can be, for example, any chip utilizing one or more of an embodiment of the invention's LDMOS transistors, such as transistor 202 in FIG. 2 or transistor 302 in FIG. 3. In one embodiment, IC chip 408 may not be mounted on circuit board 414, and may be interconnected with other modules on different circuit boards. As stated above, circuit 416 is situated in IC chip 408 and can comprise one or more of the invention's transistors designated by numeral 418. Further shown in FIG. 4, discrete components 410 and 412 are mounted on circuit board 414 and can each be, for example, a discrete filter, such as one including a SAW filter, a BAW filter, or the like, a power amplifier or an operational amplifier, a semiconductor device, such as a transistor or a diode or the like, an antenna element, an inductor, a capacitor, or a resistor.

Electronic system 400 can be, for example, a wired or wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring equipment, digital avionics equipment, or a digitally-controlled medical equipment, or any other kind of module utilized in modern electronics applications.

Thus, as discussed above, by forming body tie regions immediately adjacent to a source region and a gate, an embodiment of the invention in FIG. 2 achieves a transistor, such as an LDMOS transistor having a reduced product of on-resistance (Rdson) and transistor area (i.e. transistor footprint) compared to a conventional LDMOS transistor having a source region situated between a body tie region and a gate, such as conventional transistor 102 in FIG. 1. By forming multiple body tie regions and multiple source regions situated immediately adjacent to two gate fingers, where each body tie region is situated adjacent to at least one source region, an embodiment of the invention in FIG. 2 achieves a transistor, such as an LDMOS dual gate finger transistor having a reduced product of on-resistance and transistor area compared to a conventional LDMOS dual gate finger transistor, where each of two gate fingers is situated adjacent to only one of two source regions, and where a body tie region separates the source regions.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A Metal Oxide Semiconductor (MOS) transistor comprising:
    a gate having a first side situated immediately adjacent to at least one source region and at least one body tie region such that said at least one source region is not situated between said first side of said gate and said at least one body tie region;
    at least one contact situated over said at least one source region and not situated over said at least one body tie region;
    a drain region spaced apart from a second side of said gate;
    a body region in contact with said at least one body tie region;
    a lightly doped region surrounding said body region and separating said body region from a lightly doped drain region, said lightly doped region not surrounding said lightly doped drain region;
    wherein said at least one body tie region is electrically connected to said at least one source region.

2. The MOS transistor of claim 1, wherein said lightly doped region separates said drain region from said second side of said gate.

3. The MOS transistor of claim 2, wherein said lightly doped region is situated under said gate and under and surrounding said at least one body tie region and said at least one source region.

4. The MOS transistor of claim 2, wherein said lightly doped region isolates said body region from an underlying substrate.

5. The MOS transistor of claim 1 further comprising a silicide layer situated in said at least one body tie region and said at least one source region, wherein said silicide layer electrically connects said at least one body tie region to said at least one source region.

6. The MOS transistor of claim 2, wherein said drain region is situated in said lightly doped drain (LDD) region.

7. The MOS transistor of claim 1, wherein said MOS transistor is a Lateral Diffusion Metal Oxide (LDMOS) transistor.

8. A Metal Oxide Semiconductor (MOS) transistor comprising:
    a plurality of source regions and a plurality of body tie regions situated immediately adjacent to first and second gate fingers, each of said plurality of source regions being situated adjacent to at least one of said plurality of body tie regions and not between said at least one of said plurality of body tie regions and said first and second gate fingers;
    a first drain region spaced apart from said first gate finger and a second drain region spaced apart from said second gate finger;
    a lightly doped region surrounding a body region and separating said body region from a first lightly doped drain region and from a second lightly doped drain region, said lightly doped region not surrounding said first lightly doped drain region or said second lightly doped drain region;
    wherein said plurality of source regions are electrically connected to said plurality of body tie regions.

9. The MOS transistor of claim 8, wherein said lightly doped region separates said first drain region from said first gate finger and said second drain region from said second gate finger.

10. The MOS transistor of claim 9, wherein said lightly doped region is situated under said first and second gate fingers and under and surrounding said plurality of body tie regions and said plurality of source regions.

11. The MOS transistor of claim 8, wherein said body region is situated under said first and second gate fingers, said plurality of body tie regions, and said plurality of source regions, and is in contact with said plurality of body tie regions.

12. The MOS transistor of claim 8 further comprising a silicide layer situated in each of said plurality of body tie regions and each of said plurality of source regions, wherein said silicide layer electrically connects said plurality of body tie regions to said plurality of source regions.

13. The MOS transistor of claim 9, wherein said first drain region is situated in said first lightly doped drain (LDD) region and said second drain region is situated in said second lightly doped drain (LDD) region.

14. The MOS transistor of claim 8, wherein said MOS transistor is a Lateral Diffusion Metal Oxide (LDMOS) transistor.

15. A semiconductor die comprising at least one Metal Oxide Semiconductor (MOS) transistor, said at least one MOS transistor comprising:
    a gate having a first side situated immediately adjacent to at least one source region and at least one body tie region such that said at least one source region is not situated between said first side of said gate and said at least one body tie region;
    at least one contact situated over said at least one source region and not situated over said at least one body tie region;
    a drain region spaced apart from a second side of said gate;
    a body region being in contact with said at least one body tie region;
    a lightly doped region surrounding said body region and separating said body region from a lightly doped drain region, said lightly doped region not surrounding said lightly doped region;

wherein said at least one body tie region is electrically connected to said at least one source region.

16. The semiconductor die of claim 15, wherein said lightly doped region separates said drain region from said second side of said gate.

17. The semiconductor die of claim 16, wherein said lightly doped region is situated under said gate and under and surrounding said at least one body tie region and said at least one source region.

18. The semiconductor die of claim 15, wherein said MOS transistor further comprises a silicide layer situated in said at least one body tie region and said at least one source region, wherein said silicide layer electrically connects said at least one body tie region to said at least one source region.

19. The semiconductor die of claim 16, wherein said drain region is situated in said lightly doped drain (LDD) region.

20. The semiconductor die of claim 15, wherein said semiconductor die is utilized in a circuit board as a part of an electronic system, said electronic system being selected from the group consisting of a wired communications device, a wireless communications device, a cell phone, a switching device, a router, a repeater, a codec, a local area network (LAN), a wireless local area network (WLAN), a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, a radio frequency (RF) transceiver, a personal digital assistant (PDA), a digital game playing device, a digital testing and/or measuring device, a digital avionics device, a medical device, and a digitally-controlled medical equipment.

* * * * *